(12) United States Patent
Scott et al.

(10) Patent No.: US 12,176,855 B2
(45) Date of Patent: Dec. 24, 2024

(54) POWER AMPLIFIER HAVING IMPROVED GATE OXIDE INTEGRITY

(71) Applicant: Qorvo US, Inc., Greensboro, NC (US)

(72) Inventors: Baker Scott, San Jose, CA (US);
George Maxim, Saratoga, CA (US)

(73) Assignee: Qorvo US, Inc., Greensboro, NC (US)

( * ) Notice: Subject to any disclaimer, the term of this patent is extended or adjusted under 35 U.S.C. 154(b) by 489 days.

(21) Appl. No.: 17/456,060

(22) Filed: Nov. 22, 2021

(65) Prior Publication Data
US 2023/0163726 A1    May 25, 2023

(51) Int. Cl.
*H03F 1/02*    (2006.01)
*H03F 3/21*    (2006.01)

(52) U.S. Cl.
CPC ............ *H03F 1/0288* (2013.01); *H03F 3/211* (2013.01); *H03F 2200/451* (2013.01)

(58) Field of Classification Search
CPC .............................. H03F 1/0288; H03F 3/211
See application file for complete search history.

(56) References Cited

U.S. PATENT DOCUMENTS

| 3,999,139 A | * | 12/1976 | Fennell | ....................... | H03F 3/34 330/296 |
| 6,741,137 B1 | * | 5/2004 | Sibrai | ....................... | H03B 5/36 331/109 |
| 10,938,349 B1 | * | 3/2021 | Ayranci | ................... | H03F 3/193 |
| 2007/0159373 A1 | * | 7/2007 | Peschke | ........... | H03K 19/00315 341/156 |
| 2009/0230770 A1 | * | 9/2009 | Takeuchi | ............... | G11C 5/143 307/43 |
| 2010/0237945 A1 | * | 9/2010 | Cassia | ..................... | H03F 3/211 330/277 |
| 2011/0012682 A1 | | 1/2011 | Heijden et al. | | |
| 2015/0270806 A1 | * | 9/2015 | Wagh | .................. | H03F 3/45188 330/296 |
| 2021/0159860 A1 | * | 5/2021 | Pehlivanoglu | .......... | H03F 3/181 |
| 2021/0257979 A1 | * | 8/2021 | Jo | ............................. | H03F 1/22 |

OTHER PUBLICATIONS

International Preliminary Report on Patentability for International Patent Application No. PCT/US2022/080187, mailed Jan. 25, 2024, 15 pages.
Sowlati, T. et al., "A 2.4-GHz 0.18-um CMOS Self-Biased Cascode Power Amplifier," IEEE Journal of Solid-State Circuits, vol. 38, No. 8, Aug. 2003, IEEE, 7 pages.
International Search Report and Written Opinion for International Patent Application No. PCT/US2022/080187, mailed Mar. 24, 2023, 13 pages.

* cited by examiner

*Primary Examiner* — Patricia T Nguyen
(74) *Attorney, Agent, or Firm* — Withrow & Terranova, P.L.L.C.

(57) ABSTRACT

Power amplifiers having improved gate oxide integrity are disclosed. In particular, a dynamic asymmetric cascode bias circuit is used to provide a bias signal to a cascode power amplifier stage. The bias signal swings in synchronicity with an output signal from the power amplifier stage. By having this dynamic bias signal, the gate-drain stress on the device is reduced, preserving gate oxide integrity. Preserving gate oxide integrity helps preserve the operational profile and extend device life, providing an enhanced user experience.

19 Claims, 5 Drawing Sheets

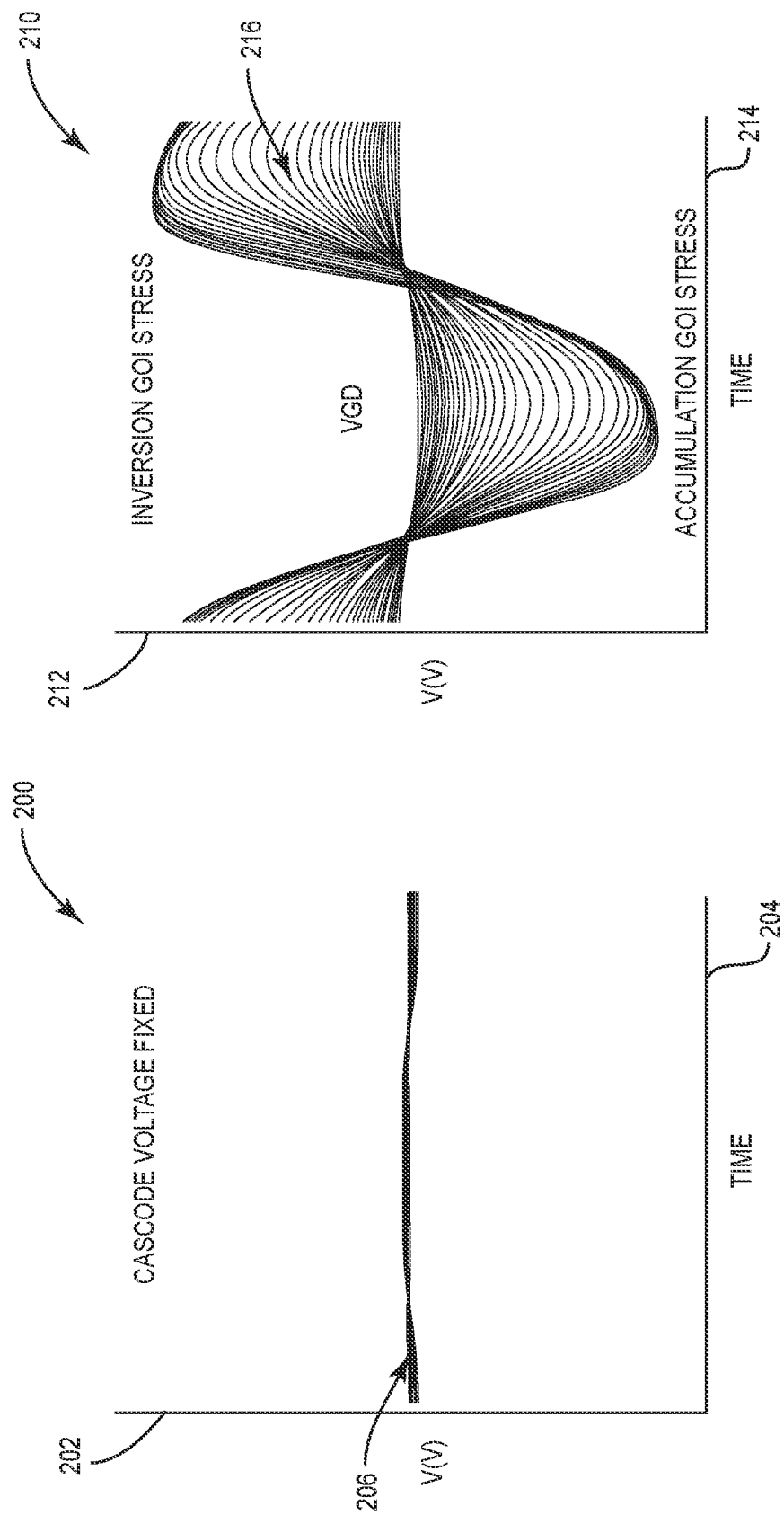

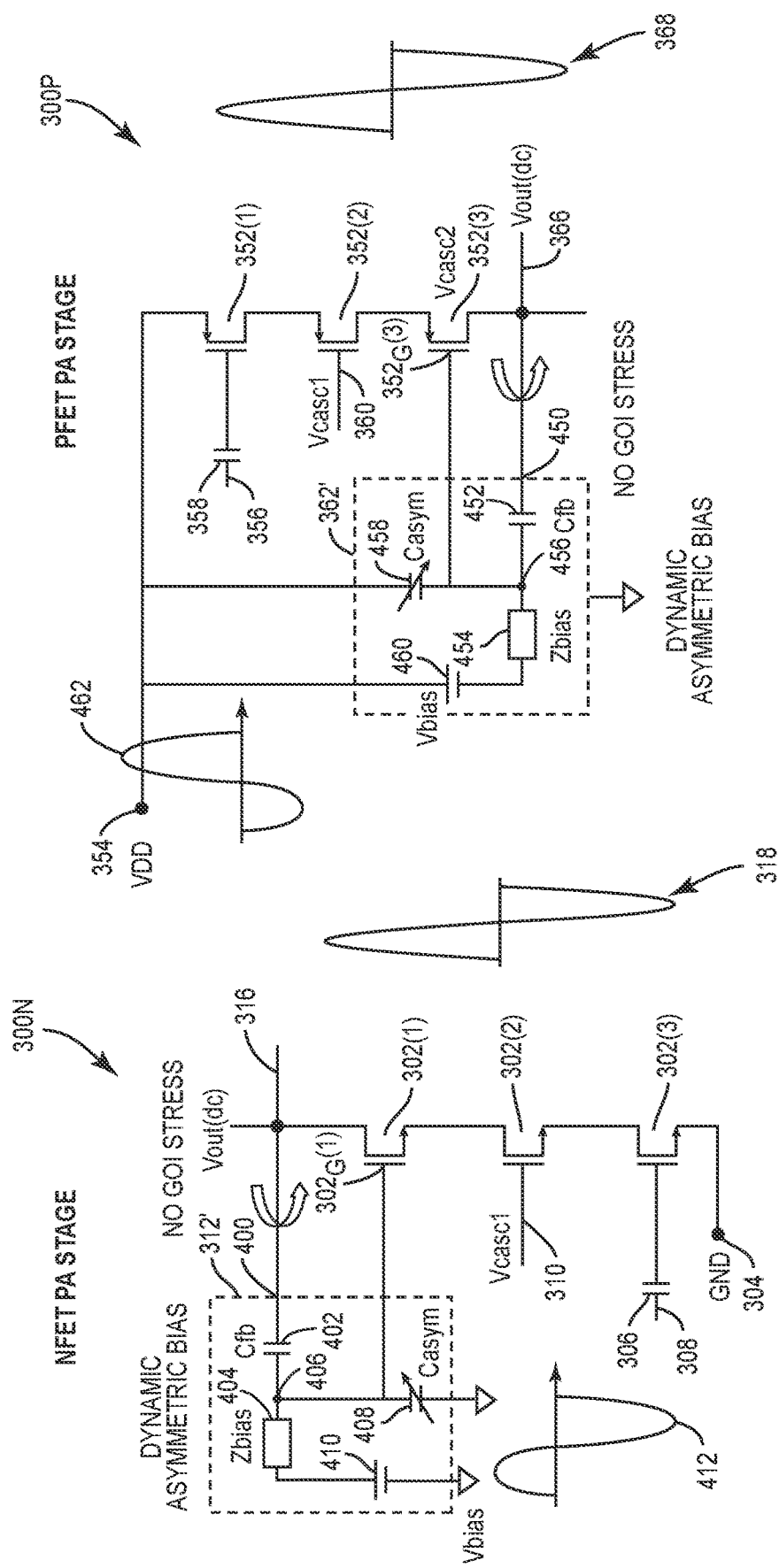

POWER AMPLIFIER HAVING IMPROVED GATE OXIDE INTEGRITY

BACKGROUND

I. Field of the Disclosure

The technology of the disclosure relates generally to power amplifiers that may be formed from complementary metal oxide semiconductors (CMOS) field-effect transistors (FETs) and, in particular, to FETs having a cascode bias.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. With the advent of the 5G cellular standards, there has been increased attention paid to power amplifiers that work at the millimeter wave sizes common to 5G. In particular, while bipolar transistors are generally able to handle large voltages such as those necessary for signal transmission in 5G, bipolar processes generally cannot handle high transition frequencies. Complementary metal oxide semiconductor (CMOS) field-effect transistors (FETs) can handle high transition frequencies, but suffer from relatively low breakdown voltages.

A common solution to make power amplifier stages using CMOS FETs is through the use of cascode configurations. The cascode gate is biased with voltages having relatively low residual radio frequency (RF) signals. As the CMOS FETs continue to shrink into the nanometer scale, this bias may result in over-stress for the cascode FET. Such overstress may, in turn, negatively impact gate oxide integrity. Compromising the gate oxide integrity results in device degradation and performance degradation. Accordingly, there is room for improvement in the biasing schemes for cascode-configured power amplifier stages that use CMOS FETs.

SUMMARY

Aspects disclosed in the detailed description include power amplifiers having improved gate oxide integrity. In particular, exemplary aspects of the present disclosure provide a dynamic asymmetric cascode bias circuit that provides a bias signal to a cascode power amplifier stage. The bias signal swings in synchronicity with an output signal from the power amplifier stage. By having this dynamic bias signal, the gate-drain stress on the device is reduced, preserving gate oxide integrity. Preserving gate oxide integrity helps preserve the operational profile and extend device life, providing an enhanced user experience.

In this regard in one aspect, a power amplifier stage is disclosed. The power amplifier stage comprises a first amplifying transistor comprising a first gate and a first drain. The power amplifier stage also comprises a second cascode transistor comprising a second gate and a second drain. The power amplifier stage also comprises a dynamic asymmetric bias circuit coupled to the second gate and the second drain of the second cascode transistor. The dynamic asymmetric bias circuit is configured to adjust a bias signal provided to the second gate based on an output signal at the second drain.

BRIEF DESCRIPTION OF THE DRAWINGS

FIG. 2A is a voltage versus time graph for a cascode voltage with a small signal present;

FIG. 2B is a voltage versus time graph for the gate-drain voltage of a cascode power amplifier stage with a large gate oxide integrity stress both in inversion and accumulation operation modes;

FIG. 4A is a circuit diagram showing details of the dynamic asymmetric bias circuit for the cascode power amplifier stage of FIG. 3A;

FIG. 4B is a circuit diagram showing details of the dynamic asymmetric bias circuit for the cascode power amplifier stage of FIG. 3B.

DETAILED DESCRIPTION

Figures 1A, 1B:
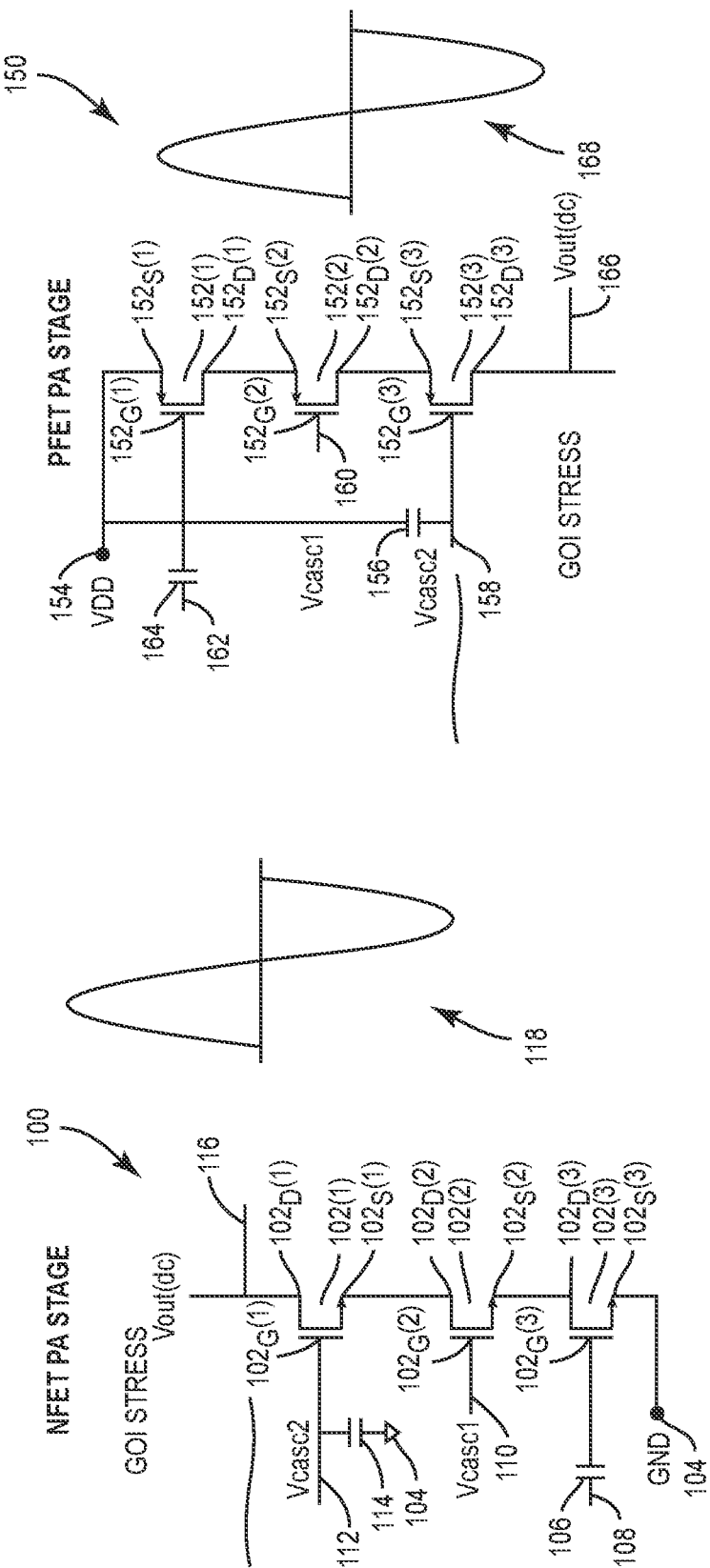
FIG. 1A is a circuit diagram of a conventional n-based field-effect transistor (FET) (NFET) cascode power amplifier stage with output swing shown.
FIG. 1B is a circuit diagram of a conventional p-based FET (PFET) cascode power amplifier stage without swing shown.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that When an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used. herein should be interpreted as having a meaning that is consistent with their meaning in the context of this specification and the relevant art and will not be interpreted in an idealized or overly formal sense unless expressly so defined herein. Any aspect described herein as "exemplary" is not necessarily to be construed as preferred or advantageous over other aspects.

Aspects disclosed in the detailed description include power amplifiers having improved gate oxide integrity. In particular, exemplary aspects of the present disclosure provide a dynamic asymmetric cascode bias circuit that provides a bias signal to a cascode power amplifier stage. The bias signal swings in synchronicity with an output signal from the power amplifier stage. By having this dynamic bias signal, the gate-drain stress on the device is reduced, preserving gate oxide integrity. Preserving gate oxide integrity helps preserve the operational profile and extend device life, providing an enhanced user experience.

Before addressing exemplary aspects of the present disclosure, a brief overview of conventional cascode-based power amplifier stages and the appurtenant problems thereof are discussed with reference to FIGS. 1A-2B. A discussion of a cascode power amplifier stage having a dynamic bias circuit begins below with reference to FIG. 3A.

In general, power amplifiers rarely are implemented in complementary metal oxide semiconductor (CMOS) technology, in part because of the poor power capability of the field-effect transistors (FETs) and sub-par linearity. The poor power capability comes from the much lower breakdown voltage of the FETs when compared to heterojunction bipolar transistors (HBT). In some implementations, cascode stages are used to boost voltage handling.

In this regard, FIG. 1A is a circuit diagram of a power amplifier stage 100, In particular, the power amplifier stage 100 includes cascoded FETs 102(1)-102(3). More specifically, the FETs 102(1)-102(3) are n-type FETs (NFETs). A source $102_S(3)$ of the FET 102(3) may be coupled to ground 104. A gate $102_G(3)$ of the FET 102(3) may be coupled to an alternating current (AC) block capacitor 106 and signal input 108. The source $102_S(2)$ of the FET 102(2) is coupled to a drain $102_D(3)$ of the FET 102(3). A gate $102_G(2)$ of the FET 102(2) is coupled to a first bias input 110 through which it receives signal Vcasc1. A source $102_S(1)$ of the FET 102(1) is coupled to a drain $102_D(2)$ of the FET 102(2). A gate $102_G(1)$ of the FET 102(1) is coupled to a second bias input 112 through which it receives signal Vcasc2. The second bias input 112 may also be coupled to ground 104 through a capacitor 114. In general, the signal at the gate $102_G(1)$ is relatively small. A drain $102_D(1)$ of the FET 102(1) is coupled to an output 116 which provides output signal Vout(dc), which may have relatively large swings as shown by graph 118. The large swing at the output 116 relative to the small signal at the second bias input 112 (i.e., the change in $V_{GD}$) results in stress on the gate oxide within the power amplifier stage 100 and may shorten device life. More detail on this stress is discussed below with reference to FIGS. 2A and 2B.

FIG. 1B is a circuit diagram of a power amplifier stage 150. In particular, the power amplifier stage 150 includes cascoded FETs 152(1)-152(3). More specifically, the FETs 152(1)-152(3) are p-type FETs (PFETs). A source $152_S(1)$ of the FET 152(1) may be coupled to a voltage source (VDD) 154. A gate $152_G(3)$ ©f the FET 152(3) may likewise be coupled to the voltage source 154, albeit through an AC block capacitor 156. The gate $152_G(3)$ is also coupled to a bias signal input 158 though which a signal Vcasc2 is received. A source $152_S(3)$ of the FET 152(3) is coupled to a drain $152_D(2)$ of the FET 152(2). A gate $152_G(2)$ of the FET 152(2) is coupled to an input 160 through which it receives signal Vcasc1. A source $152_S(2)$ of the FET 152(2) is coupled to a drain $152_D(1)$ of the FET 152(1). A gate $152_G(1)$ of the FET 152(1) is coupled to an input 162 through an AC block capacitor 164. In general, the signal at the gate $152_G(3)$ is relatively small. A drain $152_D(3)$ of the FET 152(3) is coupled to an output 166 which provides output signal Vout(dc), which may have relatively large swings as shown by graph 168. The large swing at the output 166 relative to the small signal at the input 162 (i.e., the change in $V_{GD}$) results in stress on the gate oxide within the power amplifier stage 150 and may shorten device life. More detail on this stress is discussed below with reference to FIGS. 2A and 2B.

In particular, FIG. 2A shows a graph 200 with a voltage axis 202 against a time axis 204. A cascode voltage 206 is illustrated in the graph 200, and it is readily apparent that the cascode voltage 206 is relatively constant. In contrast, FIG. 2B shows a graph 210 with a voltage axis 212 against a time axis 214. Signal 216 corresponds to the $V_{GD}$ voltage (i.e., the voltage between the gate and drain) of the FETs 102(1) or 152(3) across the same time period as the input voltage shown by the cascode voltage 206 in FIG. 2A. It is readily seen that, even though the cascode voltage 206 is relatively constant, there are large positive and negative swings in $V_{GD}$, which results in gate oxide integrity stress. As rioted, such stress may create reliability or lifetime issues for the FETs.

Figures 3A, 3B:
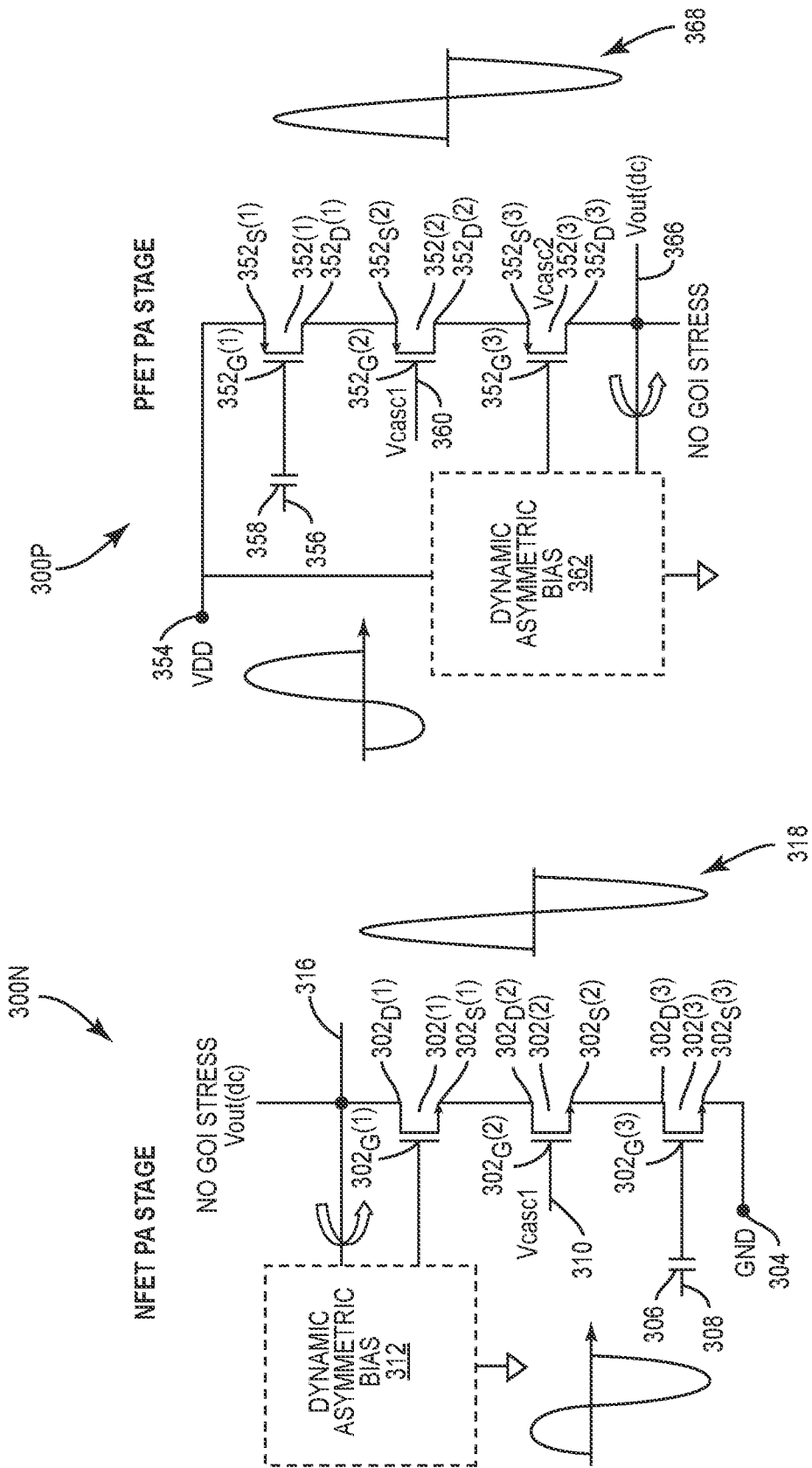
FIG. 3A is a circuit diagram of an NFET cascode power amplifier stage with a dynamic asymmetric bias circuit according to an exemplary aspect of the present disclosure.
FIG. 3B is a circuit diagram of a PFET cascode power amplifier stage with a dynamic asymmetric bias circuit according to an exemplary aspect of the present disclosure.

Exemplary aspects of the present disclosure provide a way to implement power amplifier stages in low nanometer scale using CMOS processes that have relatively low breakdown voltages while reducing the $V_{GD}$ stress of cascode devices in the power amplifier stage. Specifically, exemplary aspects of the present disclosure contemplate adding a dynamic asymmetric bias circuit to the cascode FET so as to reduce the $V_GD$ voltage and thereby reduce the stress on the gate oxide, In this regard, FIGS. 3A and 313 illustrate NFET power amplifier stage 300N and PFET power amplifier stage 300P, respectively. The NFET power amplifier stage 300N may include NFETs 302(1)-302(3), The NFET 302(1) may be a first amplifying transistor and the NFETs 302(2)-302(3) may be cascoded transistors. The NFET 302(3) is coupled to a ground 304 through by a source $302_S(3)$. A gate $302_G(3)$ of the NFET 302(3) may be coupled to an AC block capacitor 306 and signal input 308. A source $302_S(2)$ of the NFET 302(2) is coupled to a drain $302_D(3)$ of the NFET 302(3). A gate $302_G(2)$ of the NFET 302(2) is coupled to a first bias input 310 through which it receives signal Vcasc1. A source $302_S(1)$ of the NFET 302(1) is coupled to a drain $302_D(2)$ of the NFET 302(2). A gate $302_G(1)$ of the NFET 302(1) is coupled to a dynamic asymmetric bias circuit 312. A drain $302_D(1)$ of the NFET 302(1) is coupled to an output 316 which provides output signal Vout(dc), which may have relatively large swings as shown by graph 318. The dynamic asymmetric bias circuit 312 may also be coupled to the output 316.

Similarly, in FIG. 3B, the PFET power amplifier stage 300P includes cascoded PFETs 352(1)-352(3). The PFET 352(1) may be a first amplifying transistor and the PFET's 352(2)-352(3) may be cascoded transistors. A source $352_S(1)$ of the PFET 352(1) may be coupled to a voltage source (VDD) 354. A gate $352_G(1)$ of the PFET 352(1) is coupled to an input 356 through an AC block capacitor 358. A drain $352_D(1)$ of the PITT 352(1) may be coupled to a source $352_S(2)$ of the PFET 352(2). A gate $352_G(2)$ of the PFET 352(2) may be coupled to an input 360 through which the signal Vcasc1 may be received. A drain $352_D(2)$ of the PFET 352(2) may be coupled to a source $352_S(3)$ of the PFET 352(3). A gate $352_G(3)$ of the PFET 352(3) is coupled to a dynamic asymmetric bias circuit 362. The dynamic asymmetric bias circuit 362 may also be coupled to the voltage source 354. A drain $352_D(3)$ of the PFET 352(3) is coupled to an output 366 which provides output signal Vout(dc), which may have relatively large swings as shown by graph 368.

FIGS. 4A and 4B illustrate exemplary dynamic asymmetric bias circuits 312' and 362', respectively, integrated into the power amplifier stages 300N and 300P, respectively. The dynamic asymmetric bias circuits 312' and 362' use a voltage divider driven by the stage output signal. By way of example, a capacitive non-linear voltage divider will ensure the synchronicity with the output voltage, without consuming unnecessary power. In particular, the dynamic asymmetric bias circuit 312' of FIG. 4A may include an input 400 coupled to the output 316. A constant capacitor (Cfb) 402 may be coupled to the input 400 and a bias impedance (Zbias) 404 at a node 406. The node 406 may also be coupled to a variable capacitor 408 and to the gate 30241). The variable capacitor 408 may be a varactor and, more specifically, may be a MOS inversion or MOS accumulation device. The bias impedance 404 may be coupled to a voltage source (Vbias) 410.

Similarly, the bias circuit 362' of FIG. 4113 may include an input 450 coupled to the output 366, A constant capacitor (Cfb) 452 may be coupled to the input 450 and a bias impedance (Zbias) 454 at a node 456. The node 456 may also be coupled to a variable capacitor 458 and to the gate $352_G(3)$. The variable capacitor 458 may be a varactor and, more specifically, may be a MOS inversion or MOS accumulation device. The bias impedance 454 may be coupled to a voltage source (Vbias) 460.

By changing the capacitance based on the input signal, bias signals 412, 462 provided to the gates $302_G(1)$, $352_G(3)$ may be controlled synchronously relative to the output signal such that $V_{GD}$ is more reasonable, which in turn reduces stress on the gate oxide, thereby preserving gate oxide integrity. In particular, the value of the nonlinear capacitance placed in the gate of the cascode may be varied along the RF cycle by producing a larger capacitance on one end of the RF input swing and a lower capacitance on the other end of the RF input swing.

Figure 5:
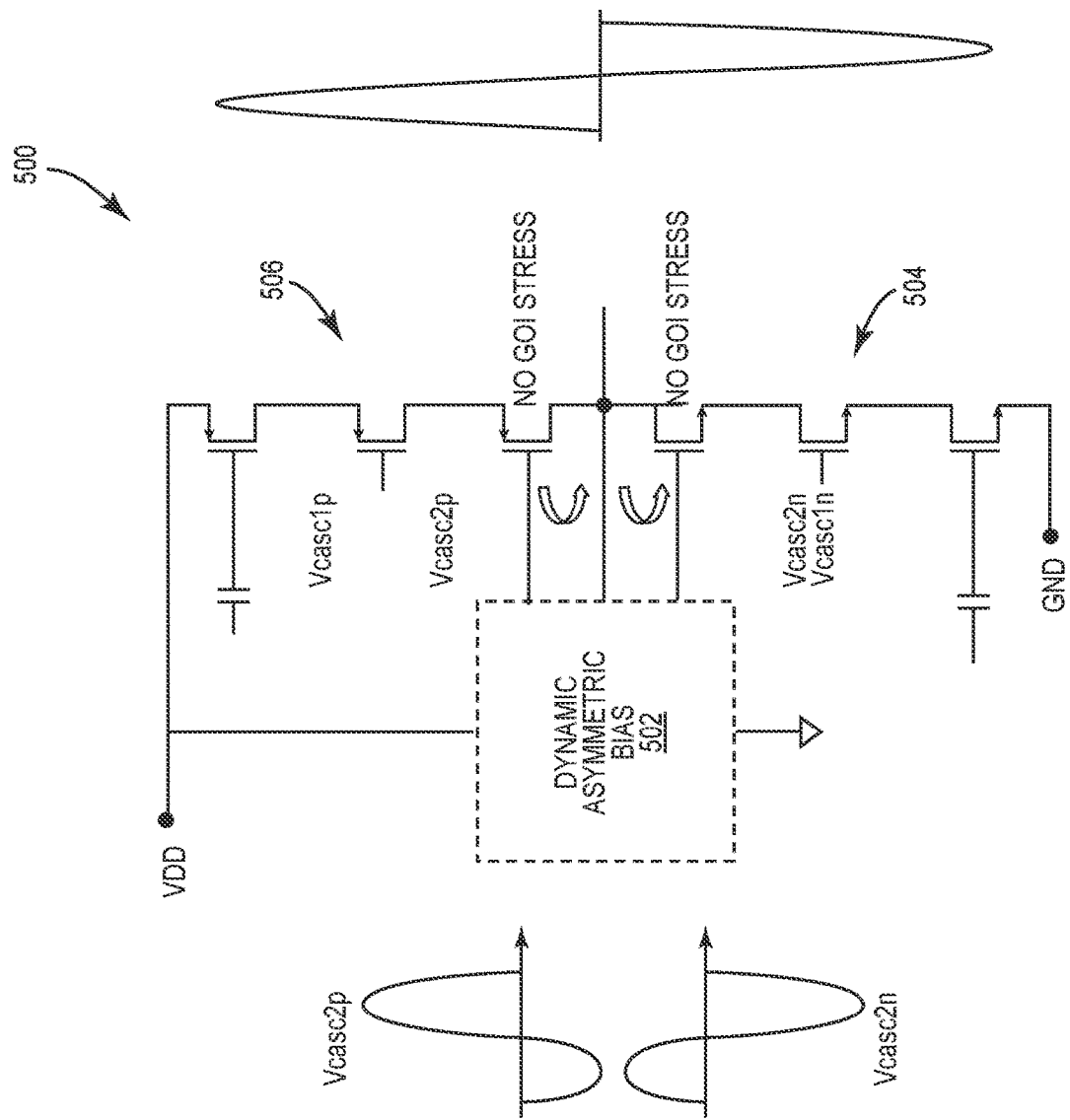
FIG. 5 provides a circuit diagram for a complementary metal oxide semiconductor (CMOS) cascode power amplifier stage where the NFET and PFET share a dynamic asymmetric bias circuit according to an exemplary aspect of the present disclosure.

While the above discussion has contemplated separate dynamic asymmetric bias circuits for PFETs and NFETs, it should be appreciated that in many CMOS implementations, NFETs and PFETs are proximate one another. Accordingly, as illustrated in FIG. 5, a CMOS power amplifier stage 500 may include a single dynamic asymmetric bias circuit 502 that provides bias signals for both an NFET power amplifier stage 504 and for a PFET power amplifier stage 506. Alternatively, the dynamic asymmetric bias circuit 502 could couple only to one or the other of the power amplifier stages 504, 506. The dynamic asymmetric bias circuit 502 will take the stage output voltage (Vout) and generate the two cascode gate voltage signals that have a direct current (DC) component and an overlapped asymmetric RF signal that is synchronous with the stage output RF signal (Vout) and reduces the gate-drain stress on the device.

While not specifically illustrated, it should be appreciated that the power amplifier stages described herein could be formed as part of a bulk CMOS process. Likewise, the FETs described herein could be formed on a silicon-on-insulator (SOI) substrate, where the SOI substrate is partially or fully depleted as needed or desired. Still further, a bipolar process (e.g., biCMOS) could be used. Still further, while only single-ended structures are shown, a differential structure could also benefit from the present disclosure. Still further, the power amplifier stages described herein could also be integrated into a quadrature or other phase-shifted structure, a Doherty or other out-phasing power amplifier, or the like. As still another possible aspect, a power amplifier stage according to the present disclosure may be formed through a metal oxide semiconductor (MOS) process and coupled to a second amplifier stage (not shown) formed through a bipolar process.

The power amplifiers having improve gate oxide integrity according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

The previous description of the disclosure is provided to enable any person skilled in the art to make or use the disclosure, Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. A power amplifier stage comprising:
   a first amplifying transistor comprising a first gate and a first drain;
   a second cascode transistor comprising a second gate and a second drain;
   a dynamic asymmetric bias circuit comprising a nonlinear voltage divider comprising a variable capacitor, wherein the dynamic asymmetric bias circuit is coupled to the second gate and the second drain of the second cascode transistor, wherein the dynamic asymmetric bias circuit is configured to adjust a bias signal provided to the second gate based on an output signal at the second drain and operation of the variable capacitor, wherein the variable capacitor changes capacitance along a radio frequency (RF) cycle to produce a larger capacitance on one end of an input swing of the RF cycle and a lower capacitance on another end of the input swing such that the bias signal is asymmetrical.

2. The power amplifier stage of claim 1, wherein the bias signal changes synchronously with the output signal.

3. The power amplifier stage of claim 1, wherein the bias signal changes so as to minimize a voltage drop between the second gate and the second drain.

4. The power amplifier stage of claim 1, further comprising a third transistor cascoded with the first amplifying transistor and the second cascode transistor.

5. The power amplifier stage of claim 4, wherein the first amplifying transistor comprises a first amplifying field-effect transistor (FET).

6. The power amplifier stage of claim 5, wherein the first amplifying FET comprises an n-type FET.

7. The power amplifier stage of claim 5, wherein the first amplifying FET comprises a p-type FET.

8. The power amplifier stage of claim 6, further comprising a second amplifying transistor, wherein the second amplifying transistor comprises a second amplifying FET, wherein the second amplifying FET comprises a p-type FET, wherein the p-type FET is coupled to the dynamic asymmetric bias circuit.

9. The power amplifier stage of claim 6, further comprising a second amplifying transistor, wherein the second amplifying transistor comprises a second amplifying FET, wherein the second amplifying FET comprises a p-type FET.

10. The power amplifier stage of claim 9, wherein the power amplifier stage is formed through a bulk complementary metal oxide semiconductor (CMOS) process.

11. The power amplifier stage of claim 9, wherein the first amplifying FET and the second amplifying FET are formed on a partially-depleted silicon-on-insulator (SOI) substrate.

12. The power amplifier stage of claim 9, wherein the first amplifying FET and the second amplifying FET are formed on a fully-depleted silicon-on-insulator (SOI) substrate.

13. The power amplifier stage of claim 1, wherein the power amplifier stage comprises a single-ended power amplifier stage.

14. The power amplifier stage of claim 1, wherein the power amplifier stage comprises a differential power amplifier stage.

15. The power amplifier stage of claim 1, wherein the power amplifier stage comprises a quadrature power amplifier stage.

16. The power amplifier stage of claim 1, wherein the power amplifier stage comprises a phase-shifted power amplifier stage.

17. The power amplifier stage of claim 1, further comprising a second amplifier stage, wherein the dynamic asymmetric bias circuit is formed through a metal oxide semiconductor (MOS) process and the second amplifier stage is formed from a bipolar process.

18. The power amplifier stage of claim 1 integrated into a Doherty power amplifier.

19. The power amplifier stage of claim 1 integrated into a transceiver in a mobile communication device.

* * * * *

UNITED STATES PATENT AND TRADEMARK OFFICE
CERTIFICATE OF CORRECTION

PATENT NO. : 12,176,855 B2
APPLICATION NO. : 17/456060
DATED : December 24, 2024
INVENTOR(S) : Baker Scott and George Maxim Page 1 of 1

It is certified that error appears in the above-identified patent and that said Letters Patent is hereby corrected as shown below:

In the Specification

In Column 4, Line 31, replace "@f" with --of--.

In Column 4, Line 62, replace "As rioted," with --As noted,--.

In Column 5, Line 7, replace "313" with --3B--.

In Column 5, Line 10, replace "302(1)-302(3), The" with --302(1)-302(3). The--.

In Column 5, Line 34, replace "PITT 352(1)" with --PFET 352(1)--.

In Column 5, Line 58, replace "gate 30241)." with --gate $302_G(1)$.--.

In Column 5, Line 63, replace "FIG. 4113" with --FIG. 4B--.

In Column 5, Line 64, replace "output 366, A" with --output 366. A--.

In Column 7, Line 1, replace "disclosure, Various" with --disclosure. Various--.

Signed and Sealed this
Fourth Day of February, 2025

Coke Morgan Stewart
*Acting Director of the United States Patent and Trademark Office*